United States Patent [19]
Kohdaka et al.

[11] Patent Number: 5,245,345
[45] Date of Patent: Sep. 14, 1993

[54] DIGITAL-TO-ANALOG CONVERTER WITH DELTA-SIGMA MODULATION

[75] Inventors: Takayuki Kohdaka; Mituhiro Homme; Masamitu Hirano; Tatuya Kishii; Kuniaki Morita; Juhro Hoshi, all of Hamamatsu, Japan

[73] Assignee: Yamaha Corporation, Japan

[21] Appl. No.: 777,754

[22] Filed: Oct. 11, 1991

[30] Foreign Application Priority Data

Oct. 12, 1990 [JP] Japan ................................ 2-273597

[51] Int. Cl.⁵ ........................................... H03M 1/82
[52] U.S. Cl. ..................................... 341/152; 341/143
[58] Field of Search ................. 341/143, 144, 152, 118

[56] References Cited

U.S. PATENT DOCUMENTS

| | | | |
|---|---|---|---|
| 3,754,233 | 8/1973 | Sutherland | 341/145 |
| 4,233,591 | 11/1980 | Murata et al. | 341/145 |
| 4,739,304 | 4/1988 | Takeda et al. | 341/156 |
| 5,008,675 | 4/1991 | Toyomaki | 341/152 |
| 5,021,788 | 6/1991 | Ueki et al. | 341/152 |
| 5,043,729 | 8/1991 | Fujimoto | 341/152 |

Primary Examiner—Marc S. Hoff
Attorney, Agent, or Firm—Bruce L. Adams; Van C. Wilks

[57] ABSTRACT

The digital-to-analog conversion apparatus operates in synchronization with a system clock signal having a short period to oversample and delta-sigma-modulate a digital input to produce a requantized digital signal. The system clock signal is mixed with noise leaked back due to the oversampling and delta-sigma modulating operation. The system clock signal is frequency-divided by the rate of one-fourth or less to produce a divided clock signal having a long period and being free of the noise. The requantized digital signal is detected each long period, and is pulse-modulated according to the detected results to generate a pulse signal having the long period. This pulse signal is low-pass-filtered to produce an analog output having improved S/N ratio.

10 Claims, 8 Drawing Sheets

DIGITAL-TO-ANALOG CONVERTER WITH DELTA-SIGMA MODULATION

BACKGROUND OF THE INVENTION

The present invention relates to digital-to-analog conversion apparatuses or DA conversion apparatuses utilizing oversampling technology and noise shaping technology based on delta-sigma modulation.

Figures 7, 8:
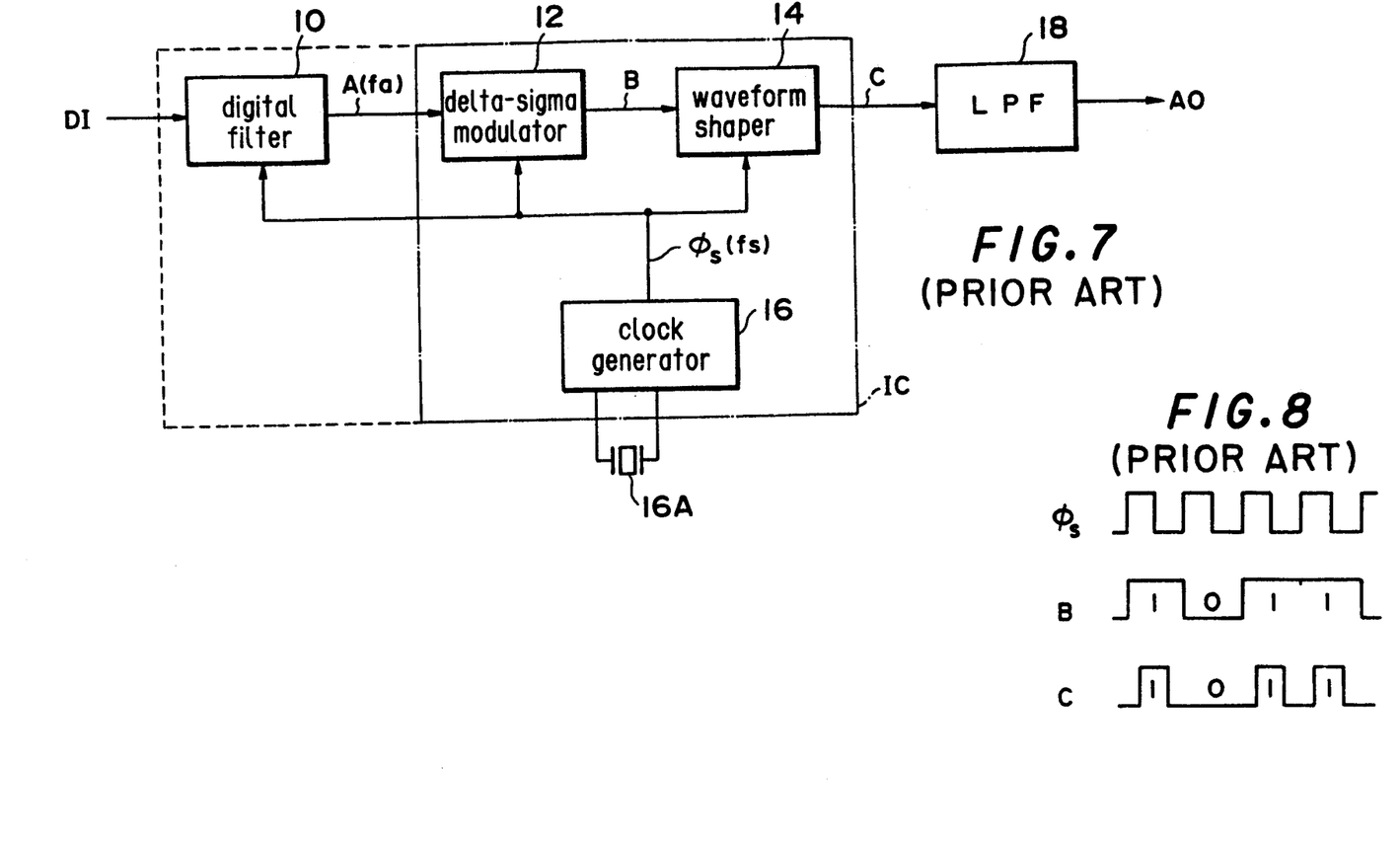
FIG. 7 is a block diagram showing the conventional DA conversion apparatus.
FIG. 8 is a waveform diagram illustrating operation of a waveform shaper used in the FIG. 7 conventional apparatus.

FIG. 7 shows an example of the conventional DA conversion apparatus utilizing the combination of oversampling technology and noise shaping technology. In FIG. 7, the DA conversion apparatus is comprised of a digital filter 10 for oversampling a multi-bit digital input DI to produce an oversampled digital signal A, a delta-sigma modulator 12 for effecting delta-sigma modulation, i.e., differentiation/integration processing of the oversampled multi-bit digital signal A to reduce a number of bits to feed a requantized digital signal B of lesser number of bits, a waveform shaper 14 for waveform-shaping pulses of the requantized digital signal B in synchronization with a clock signal to produce a shaped pulse signal C, a clock generator 16 for generating a system clock signal $\phi s$ having a given frequency fs, and a low-pass filter or LPF18 for filtering the pulse signal C to convert the same into an analog output AO corresponding to the digital input DI.

A circuit portion enclosed by the dot-and-chain line IC is comprised of an integrated circuit of the monolithic or hybrid construction disposed in a single package, while a quartz resonator 16A is externally coupled to the clock generator 16 as an oscillating source. Otherwise, the digital filter 10 and its associated parts, if any, enclosed by the broken line may be incorporated into the same integrated circuit.

The digital input DI is given in the form of a digital waveform containing, for example, a sample sequence of digital data each composed of 16 bits, i.e., one word, and being fed to the digital filter 10 at, for example, 44.1 KHz of relatively low data transfer rate. The system clock signal $\phi s$ has, for example, 16.9 MHz of high frequency fs. The oversampled digital signal A is fed from the digital filter 10 to the delta-sigma modulator 12 at, for example, 8.45 MHz (fs/2) of high data transfer rate.

The faster the oversampling rate, the better the filtering performance of the digital filter 10. However, the heavy increase of the oversampling rate may adversely affect overall design of the DA converter. In view of this, the delta-sigma modulator 12 is provided to efficiently lower an oversampling frequency or rate in the oversampling operation at the digital filter 10. The delta-sigma modulator 12 effects delta-sigma modulation of the oversampled digital signal to requantize the same such that the requantization error is significantly distributed in a higher frequency range to thereby noise-shape the digital signal. For this reason, the delta-sigma modulator 12 is called a noise shaper. The delta-sigma modulator 12 may be of single or double loop type constructed such as to produce the requantized and noise-shaped signal B in the form of a pulse-density-modulated signal or a bit stream signal. Otherwise, the delta-sigma modulator 12 may be of triple or more loop type constructed such as to produce a pulse-width-modulated signal B. The delta-sigma modulator 12 operates to convert a multi-bit digital signal to a reduced multi-bit digital signal having a lesser number of bits. Such conversion of modulation may cause a quantization error or distortion which may develop significantly in a relatively high frequency range.

Figure 9:
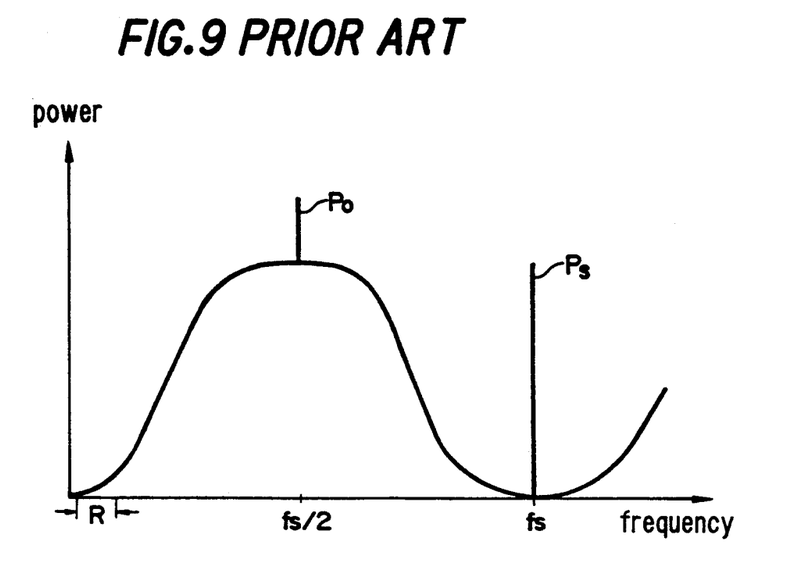
FIG. 9 is a graph showing an output power spectrum of a delta-sigma modulator provided in the FIG. 7 conventional apparatus.

Namely, FIG. 9 indicates a power spectrum of an ideal output of the delta-sigma modulator 12. The power spectrum contains a sharp peak Ps at the operating clock frequency fs of the delta-sigma modulator 12, and a maximum noise power at the vicinity of the data transfer frequency fs/2. Though not shown in FIG. 9, this spectrum is repeatedly observed in every range of 1fs, 2fs, 3fs and so on. Further, white noise may be actually superposed on the power spectrum although not shown in the FIG. 9 graph.

The noise-shaped signal B may still contain various noise factors due to fluctuation or distortion during digital requantization processing. Therefore, if the digital signal B were directly converted into an analog output by the LPF18, there would be caused a considerable error due to the noise factors. In view of this, the waveform shaper 14 is interposed to waveform-shape the requantized signal B based on the system clock signal $\phi s$ to thereby feed the wave-form shaped signal C to the LPF18 in order to reduce error due to the various noise factors.

The waveform shaper 14 carries out the waveform-shaping operation as indicated by a timing chart shown in FIG. 8. Namely, an AND operation is effected between the requantized signal B representative of a sequence of binary data, e.g., 1, 0, 1, 1,—, and a shaping clock signal formed in synchronization with the system clock signal $\phi s$ so as to produce the waveform-shaped pulse signal C comprised of a train of pulses representative of the same sequence of binary data 1, 0, 1, 1,—.

In the above noted conventional DA conversion apparatus, when the digital input shifts to a considerably small level, the requantized signal approaches a repeated pattern of 1, 1, 0 and 0 according to the delta-sigma modulation such that an intensive noise spectrum component Po develops at the frequency fs/2 as shown in FIG. 9. Further, another noise spectrum component also develops at the vicinity of the frequency fs/2 due to the internal processing in the delta-sigma modulator.

Figure 10:
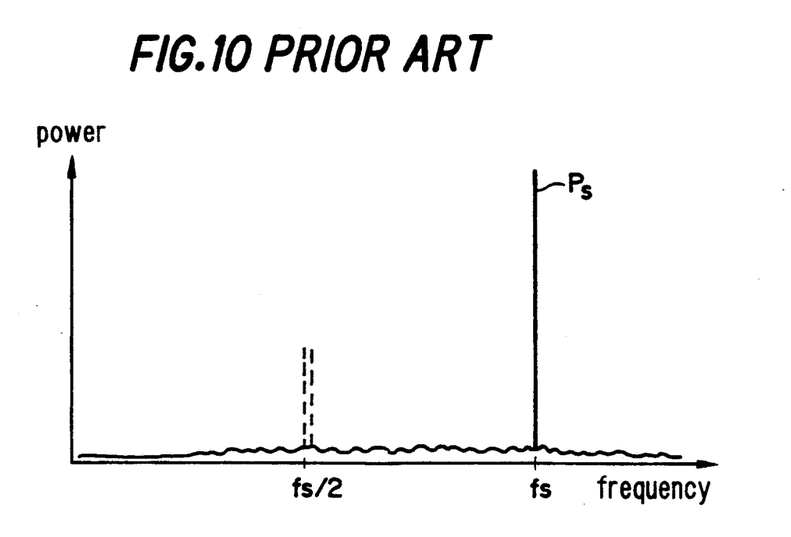
FIG. 10 is a graph showing an output power spectrum of a clock generator provided in the FIG. 7 conventional apparatus.

Therefore, these noise spectrum components at and around the frequency fs/2 are leaked back into the clock generator 16 as a noise. For this, the clock generator 16 produces an output spectrum, as shown in FIG. 10, which contains subsidiary frequency components indicated by dashed lines at and around the frequency fs/2 besides the true oscillating frequency component fs.

Similar noise leaking phenomenon may occur when the oversampled digital signal A is fed to the delta-sigma generator 12 at the transfer rate of fa=fs/2, such that a noise component at and around the frequency fs/2 is leaked into the system clock signal $\phi s$. In this case, the digital signal A transmitted from the digital filter 10 at the transfer rate of fa=fs/2 partially travels through a space into a junction terminal of the quartz resonator 16A so that the system clock signal output is mixed with a noise frequency component at and around fs/2 in manner similar to the FIG. 10 case.

In the afore-mentioned logical AND operation for the waveform-shaping, multiplication processing is effected between the requantized signal B and the system clock signal $\phi s$. Generally, multiplication operation of two waveforms having frequencies $\omega_1$ and $\omega_2$ is represented in the typical form of $\sin \omega_1 t \times \sin \omega_2 t = -\frac{1}{2}\{\cos(\omega_1+\omega_2)t - \cos(\omega_1-\omega_2)t\}$. The resulting waveform has two new frequencies $\omega_1+\omega_2$ and $\omega_1-\omega_2$. This relation can be applied to multiplication of two noise frequency components to thereby cause a folded noise at a differential frequency range $(\omega_1-\omega_2)$ and a summed frequency range $(\omega_1+\omega_2)$. In this particular case, a folded noise is generated by the multiplication processing between the noise spectrum component of the requantized signal B at and around the frequency fs/2 shown in FIG. 9 and the noise frequency component of the system clock signal $\phi$s at and around the frequency fs/2 shown in FIG. 10. Particularly, some folded noise corresponding to a differential frequency therebetween develops in the audio frequency range R (FIG. 9) to thereby hinder S/N ratio of an audio analog output.

SUMMARY OF THE INVENTION

An object of the present invention is to provide an improved DA conversion apparatus of the oversampling type constructed to eliminate a folded noise to improve S/N ratio.

According to the invention, the DA conversion apparatus includes clock means in the form of a clock generator for generating a system clock signal having a given basic frequency fs and a relatively short period, and dividing means for frequency-dividing the system clock signal to produce a divided clock signal having a frequency fs/4 or less and a relatively long period. Oversampling means in the form of a digital filter is provided to oversample a digital input containing a sequence of multi-bit data. Delta-sigma modulating means is connected to the oversampling means for effecting delta-sigma modulation of the oversampled digital input in synchronization with the system clock signal to produce a noise-shaped and requantized digital signal containing, every short period timed by the system clock signal, a requantized data comprised of a lesser number of bits than the initial multi-bit data.

Characterizingly, there is provided pulse forming means for shaping the requantized digital signal. The pulse forming means includes first means operative each long period timed by the divided clock signal for effecting a detection of a set of the requantized data occurring each long period of the detection, and second means operative in response to each detection for effecting pulse-modulation of the requantized digital signal to form a pulse signal according to results of the detection. Lastly, the pulse signal is filtered by filtering means in the form of a low-pass filter to produce an analog output corresponding to the digital input.

According to the above inventive construction, the system clock signal having a high frequency fs is frequency-divided to form a divided clock signal having a low frequency fs/4 or less. After the digital input is oversampled and noise-shaped with using the system clock signal of high frequency fs, the noise-shaped digital input is once detected with using the divided clock signal of low frequency prior to the digital-to-analog conversion.

Characterizingly, the divided clock signal of fs/4 or less frequency is free of the before-mentioned leaking noise. Generally, some noise is generated due to internal processing of the delta-sigma modulation at and around the frequency fs/2, and other noise is also generated during data transfer to the delta-sigma modulator at and around the same frequency fs/2. These noises are leaked back into the system clock signal. This means that the system clock signal of the basic frequency fs may contain noises every other clock pulse.

Figures 1, 2:
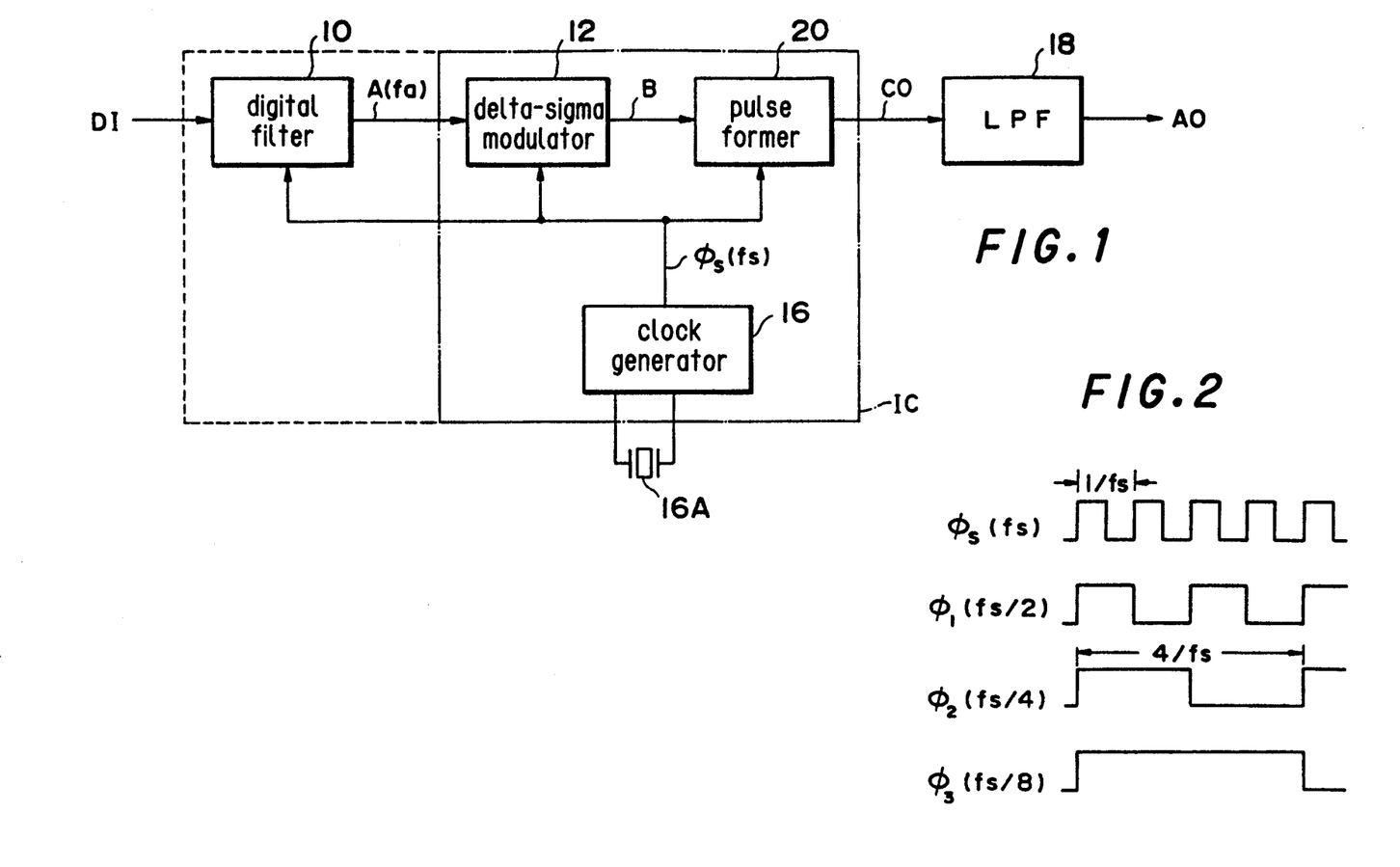
FIG. 1 is a block diagram showing a basic structure of the inventive DA conversion apparatus.
FIG. 2 is a waveform diagram showing various frequency-divided waveforms of a system clock signal $\phi$s used in the FIG. 1 apparatus.

Referring to FIG. 2, for example, if the system clock signal $\phi$s of basic frequency fs is frequency-divided by half to produce a half-divided clock signal $\phi$1 of frequency fs/2, the noises can be eliminated to some extent from the half-divided clock signal $\phi$1. Further, when the half-divided clock signal $\phi$1 is frequency-divided again by half to produce a quarter-divided clock signal $\phi$2 of frequency fs/4, the leaked noises are completely eliminated from the quarter-divided clock signal $\phi$2 which contains only the fs/4 frequency component. Still further, a one-eighth divided clock signal $\phi$3 of frequency fs/8 does not contain any leaked noises. According to the invention, the requantized digital signal is once detected and reshaped using such noise-free divided clock signal so as to avoid mixing of the leaked noises to the final analog out in the folded form.

Moreover, according to the invention, the requantized digital signal is pulse-modulated according to the detection results every period of the divided clock signal to produce a pulse signal in the form of a pulse-width, pulse-height, pulse-number, pulse-density or pulse-location modulated signal. This pulse signal is filtered to produce the final analog output, thereby considerably reducing noise and avoiding generation of folded noise which would be generated in the conventional waveform-shaping processing.

DETAILED DESCRIPTION OF THE INVENTION

FIG. 1 shows a basic circuit construction of the inventive DA conversion apparatus of the oversampling type. In the figure, the like parts are denoted by the like reference numerals as in the FIG. 7 prior art to facilitate the understanding of the invention. Namely, in similar manner to the prior art, the inventive apparatus is provided with clock means in the form of a clock generator 16 having a quartz resonator 16A for generating a system clock signal $\phi s$ having a given basic high frequency fs and a relatively short period 1/fs as shown in FIG. 2. Oversampling means is provided in the form of a digital filter 10 for oversampling a digital input DI containing a sample sequence of multi-bit data or words. Delta-sigma modulating means is provided in the form of a delta-sigma modulator 12 operative in synchronization with the high frequency system clock signal $\phi s$ for requantizing the oversampled digital input A fed thereto at a rate of fa=fs/2, according to delta-sigma modulation, i.e., differentiation/integration processing to produce a requantized and noise-shaped digital signal B containing every short period 1/fs timed by the system clock signal $\phi s$, a requantized data or word having a lesser number of bits than the original multi-bit data. The inventive apparatus is further provided at a last stage with filtering means in the form of an LPF18 for effecting low-pass filteration to produce an analog output AO corresponding to the initial digital input DI.

Characterizingly, the FIG. 1 inventive apparatus is provided with a sophisticated pulse former 20 interposed between the delta-sigma modulator 12 and the LPF18 instead of the simple waveform shaper 14 provided in the FIG. 7 conventional apparatus. The pulse former 20 includes dividing means for frequency-dividing the high frequency system clock signal $\phi s$ by a given rate, e.g., ¼ to produce a divided clock signal $\phi 2$, as shown in FIG. 2, having a low frequency fs/4 and a relatively long period 4/fs. As described before, the thus divided clock signal $\phi 2$ is generally free of any leaked noise.

The pulse former 20 further includes pulse forming means for pulse-modulating the requantized digital signal B into a pulse signal CO which is then filtered by the LPF18 to produce the analog output AO. The pulse forming means includes first means operative each long period 4/fs of the noise-free divided clock signal $\phi 2$ to effect a detection of a set or group of the requantized data of the digital signal B, each set occurring each long period 4/fs of the detection. For example, if the requantized digital signal B contains a binary data of "0" or "1" every short period 1/fs timed by the system clock signal $\phi s$, each set contains four serial bits, e.g., 1-1-0-1. Therefore, the detection is carried out repeatedly every long period 4/fs to read a digital value represented by the set of four serial bits.

The pulse forming means further includes second means operative in response to each detection for effecting, for example, pulse-width-modulation of the requantized digital signal B to produce a pulse signal CO according to results of the detection, such that the pulse signal CO contains every long period 4/fs a pulse having a width or duration modulated according to the detected or read digital value of four serial bits, e.g., 1-1-0-1. The pulse signal CO is filtered by the LPF18 to produce the analog output AO corresponding to the digital input. The pulse signal CO may be, otherwise, pulse-height-modulated or pulse-density-modulated according to the detection results.

Figure 3:
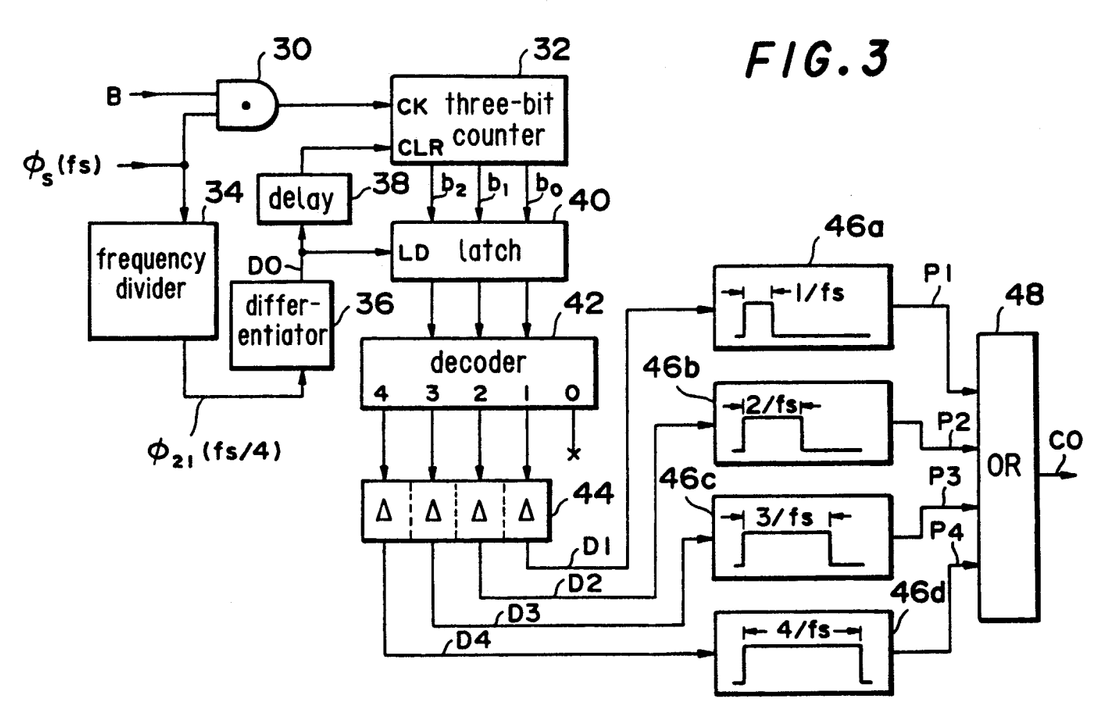
FIG. 3 is a circuit diagram showing one embodiment of a pulse former provided in the FIG. 1 apparatus.

FIG. 3 shows one embodiment of the pulse former 20. In this embodiment, there is generated a pulse signal CO having a pulse width or duration modulated according to detection results of the requantized digital signal B. The FIG. 3 circuit includes an AND gate circuit 30 receptive of a system clock signal $\phi s$ having a frequency fs (FIG. 4) and a binarily requantized signal B (FIG. 4) to produce a pulse-shaped signal CK which is fed to a three-bit counter 32. The counter 32 counts a pulse number of the signal CK to produce a set of three parallel bits b2 (MSB)-b0 (LSB) representative of its counted value. For example, as shown in FIG. 4, when the AND gate circuit 30 receives the binary signal B of 1-1-0-1 during a period 4/fs, the counter 32 outputs one set of the three parallel bits of b2=0, b1=1 and b0=1 at the end of that period 4/fs.

Figure 4:
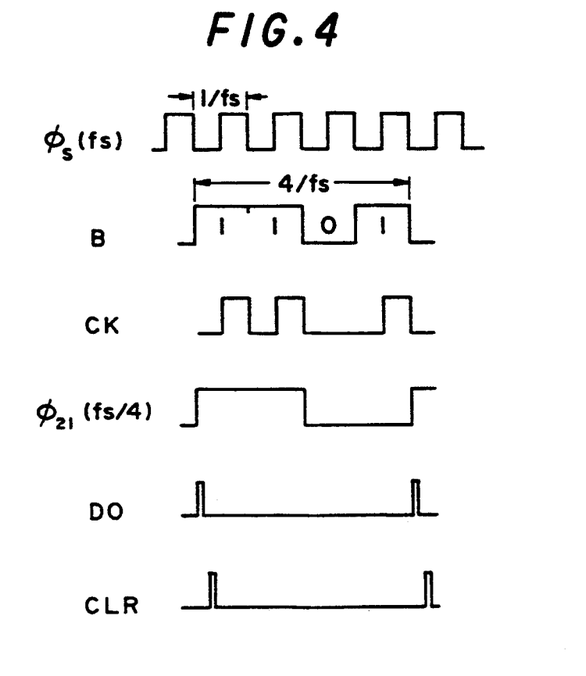
FIG. 4 is a waveform diagram illustrating operation of the FIG. 3 pulse former.

A frequency divider 34 is provided to frequency-divide the system clock signal $\phi s$ to produce a divided clock signal $\phi 21$ having a frequency fs/4 (FIG. 4 $\phi 21$). This divided clock signal $\phi 21$ is differentiated selectively at its leading edge by a differentiator 36 to produce a timing pulse DO every long period of 4/fs (FIG. 4 DO). A latch 40 operates in response to each timing pulse DO to latch therein the parallel bits of b2-b0 outputted from the counter 32. Further, a delay circuit 38 is connected to the differentiator 36 to slightly delay the timing pulse DO to produce a clear pulse CLR (FIG. 4 CLR) effective to clear the counter 32 every long period 4/fs. Thus, the counter 32 operates after the clearing to restart next pulse counting of the binary signal B during a following long period 4/fs. As understood from the above description, the AND gate circuit 30, counter 32, differentiator 36, delay circuit 38 and latch circuit 40 constitute the first means for detecting the requantized digital signal B every long period 4/fs.

A decoder 42 is provided to decode a latched set of the three parallel bits b2-b0 representative of a counted content 0, 1, 2, 3 or 4 of counter 32 indicative of a pulse number of the pulse-shaped signal CK each long period. The decoder 42 has five output terminals corresponding to respective one of the counted contents 0, 1, 2, 3 and 4. The output terminal corresponding to the count 0 is held open, while the remaining output terminals corresponding to the counts 1-4 are connected to respective input terminals of first, second, third and fourth differentiating elements Δ of a differentiation array 44.

One-shot circuits 46a-46d are connected to the respective differentiating elements Δ of the differentiating array 44 to receive therefrom corresponding outputs D1-D4 so as to generate corresponding pulses P1-P4 having different widths or durations set within one long period. Namely, the first pulse P1 has a duration of 1/fs, the second pulse P2 has a duration of 2/fs, the third pulse P3 has a duration of 3/fs and the fourth pulse P4 has a full duration of 4/fs.

An OR gate circuit 48 is connected to the four one-shot circuits 46a-46d to pass one of the pulses P1-P4, which selectively occurs each long period 4/fs, to thereby produce the pulse signal CO. As understood from the above description, the decoder 42, differentiating array 44, one-shot circuits 46a-46d and OR gate circuit 48 constitute altogether the second means for pulse-modulating the digital signal B according to the detection results to produce a corresponding pulse signal CO. For example, when a set of the three parallel bits b2=0, b1=1 and b0=1 is latched or loaded into the latch circuit 40, the decoder 42 decodes the latched set to enable a particular one of its output terminals corresponding to the count 3 of the counter 32. Consequently, the differentiating array 44 responds to selectively feed a trigger output D3 through the third differentiating element. The trigger output D3 is effective to trigger the corresponding one-shot circuit 46c to enable the same to produce a pulse P3 having a duration of 3/fs, which passes through the OR gate circuit 48 to form a pulse signal CO. This pulse duration 3/fs corresponds to pulse numbers of the pulse-shaped signal CK detected during one long period 4/fs.

Figure 5:
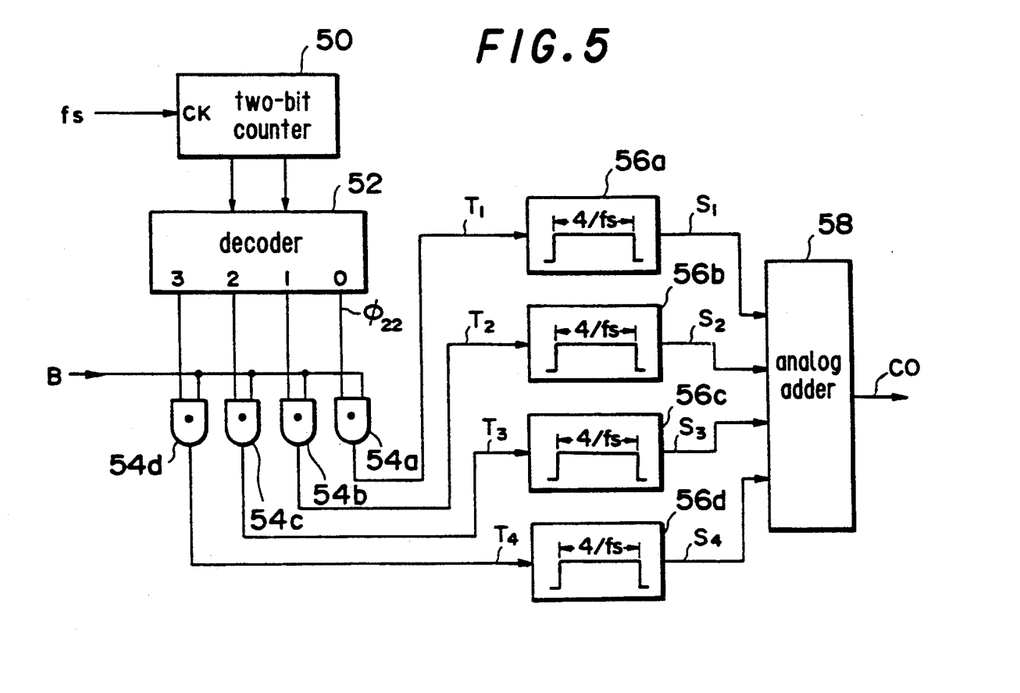
FIG. 5 is a circuit diagram showing another embodiment of the pulse former.
Figure 6:
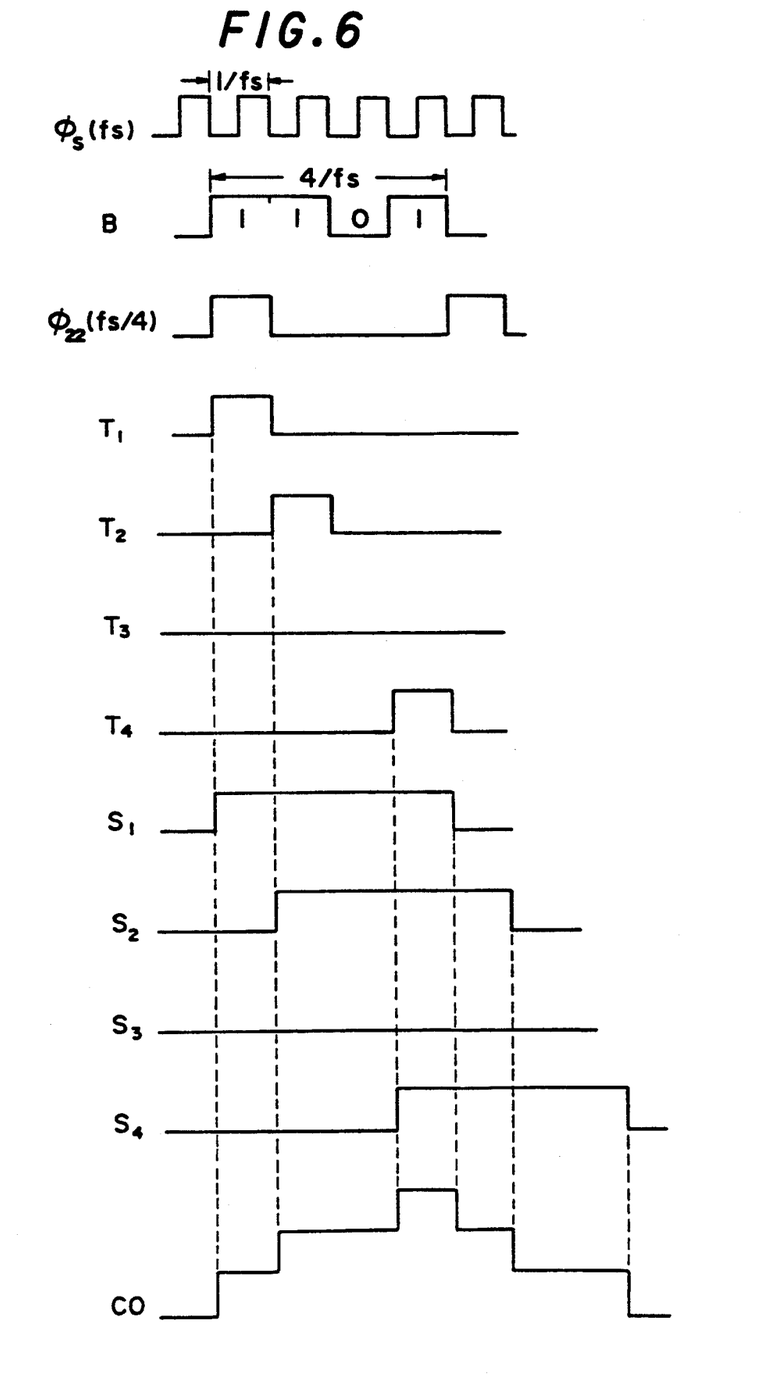
FIG. 6 is a waveform diagram illustrating operation of the FIG. 5 pulse former.

FIG. 5 shows another embodiment of the pulse former 20. In this embodiment, the pulse former is constructed to generate a pulse signal CO having a pulse height or level corresponding to the detected results of the requantized signal B. The FIG. 5 pulse former includes a two-bit cyclic counter 50 receptive of a system clock signal φs having a frequency fs (FIG. 6 φs) at its input terminal CK to feed a two-bit parallel output indicative of a cyclic count of 0, 1, 2 and 3 to a decoder 52. The decoder 52 has four output lines corresponding to the respective counts 0, 1, 2 and 3 such as to produce a first divided clock pulse signal φ22 having a duration 1/fs and a frequency fs/4 (FIG. 6 φ22) through the first output line when the count is 0 to a corresponding AND gate element 54a, as well as to sequentially feed second, third and fourth divided clock pulse signals through the respective output lines corresponding to the counts 1, 2 and 3 to corresponding AND gate elements 54b, 54c and 54d, the subsequent divided clock pulse signals having the same period 4/fs as that of the first divided clock pulse signal φ22 but being delayed therefrom by intervals of 1/fs, 2/fs and 3/fs, respectively. Thus, the counter 50 and decoder 52 constitute the frequency-dividing means. Each of the AND gate elements 54a-54d is supplied also with the requantized digital signal B (FIG. 6B). Therefore, the AND gate elements 54a-54d are sequentially and cyclicly scanned during one long period of 4/fs to detect a set of four binary data of the binarily requantized signal B in response to each of the four divided clock pulse signals. For example, when the binary signal B contains a set of four binary data 1-1-0-1 as shown in FIG. 6, the AND gate elements 54a-54d produce the detected results in the form of detection signals T1-T4 (FIG. 6 T1-T4) in which the signals T1, T2 and T4 are effective and the signal T3 is ineffective. Thus, the AND gate elements 54a-54d constitute the first means for detecting the digital signal B every long period.

One-shot elements 56a-56d receive the corresponding detection signals T1-T4 as trigger inputs for producing one-shot pulses S1-S4 each having a full duration of 4/fs. In this case, the detection signals T1, T2 and T4 are effective so that the one-shot elements 56a, 56b and 56d are selectively triggered to produce the one-shot pulses S1, S2 and S4. These pulses are summed together by an analog adder 58 to produce a composite pulse signal CO (FIG. 6 CO). The composite pulse signal CO has a stepwise-modulated pulse level which corresponds to the detected results of the digital signal B during one long period 4/fs. Thus, the one-shot elements 56a-56d and analog adder 58 constitute the second means for pulse-modulating the digital signal B according to the detection results.

In the above described FIG. 5 embodiment, each of the one-shot pulses S1-S4 has a full duration of 4/fs; however, their pulse duration or width can be set smaller than the long period 4/fs. For example, the pulse duration of the one-shot pulses S1-S4 can be set less than the short period 1/fs and concurrently the analog adder 58 is replaced by an OR gate circuit, so that there is produced a pulse signal CO containing a given number of one-shot pulses within one long period 4/fs corresponding to the detected results of the binary digital signal B. Further, the pulse width of the one-shot pulses S1-S4 may be set identical to the short period 1/fs and concurrently the analog adder 58 is replaced by an OR gate circuit, so that there is produced a pulse signal CO having the same pulse arrangement as that of the binary digital signal B but being free of noise which is contained in the initial digital signal B.

As described above, according to the invention, the requantized digital signal B is once detected in synchronization with a divided clock signal having a quarter or less of a basic frequency fs of the system clock signal. Then, the digital signal B is pulse-modulated every detection operation to produce a pulse signal CO according to the detected results, in terms of pulse width, pulse level, pulse number or pulse location. The pulse-modulated signal is lastly passed through a low-pass filter to thereby significantly reduce noise and to considerably improve S/N ratio.

Figure 11:
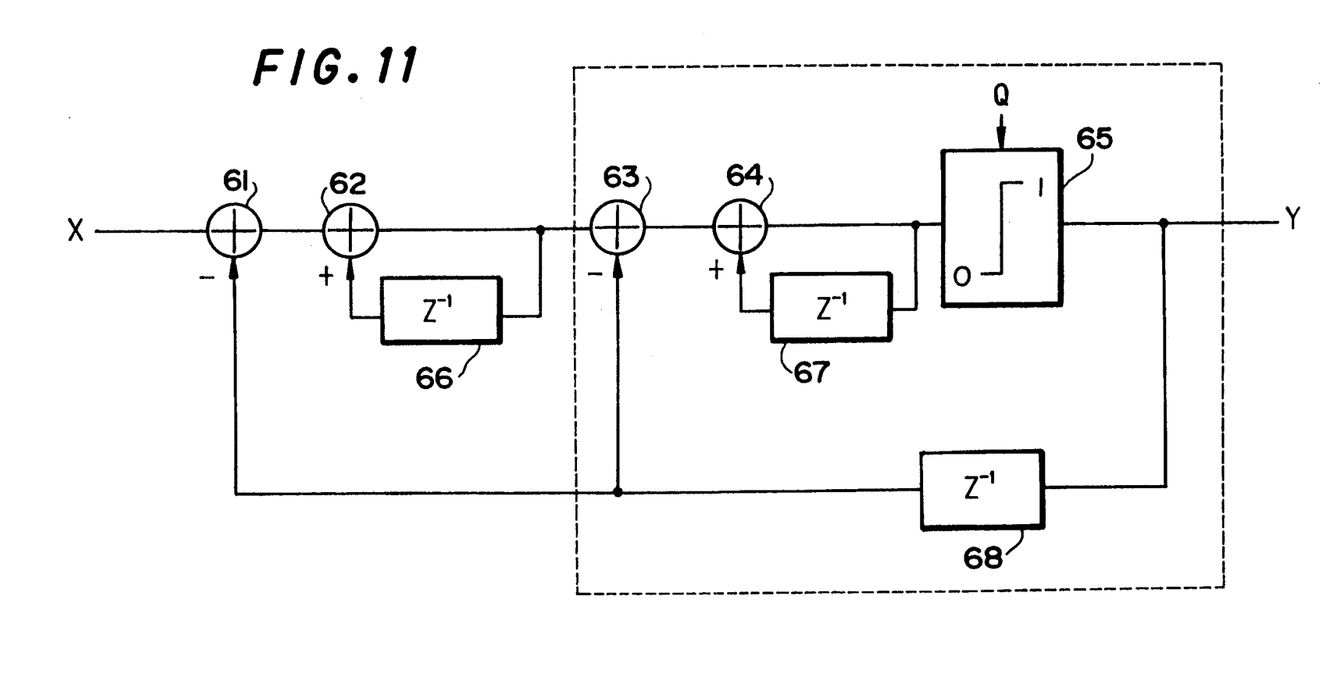
FIG. 11 is a circuit diagram showing one embodiment of a delta-sigma modulator provided in the FIG. 1 apparatus.

Additionally, FIG. 11 shows an example of the delta-sigma modulator 12 provided in the FIG. 1 DA conversion apparatus. The FIG. 11 modulator is constructed in a double loop type which includes a basic part of a single loop enclosed by the dashed line and comprised of adders 63 and 64, delay elements 67 and 68, and differentiator 65. The basic part has input/out performance represented by:

$$Y = X + (1 - Z^{-1})Q$$

wherein $Z^{-1}$ denotes delay function to delay a data by one sampling time and Q denotes a quantization error.

Figure 12:
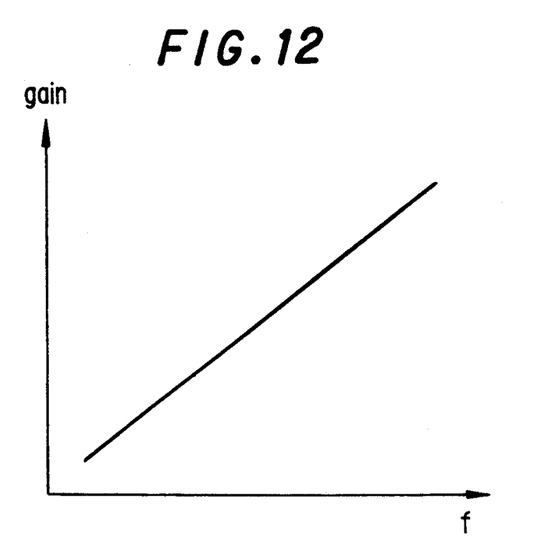
FIGS. 12 and 13 are graphs for explaining the operation of the FIG. 11 modulator.

The differentiator 65 operates as a one bit quantizer to discriminate as to whether an input data is positive or negative so as to output a data 0 or 1 according to the discrimination results. As shown in FIG. 12, the differentiator 65 has a gain which steadily increases in terms of frequency. The differentiator 65 generates a quantization error in its output. This quantization error Q is intensively distributed in higher frequency range.

Figure 13:
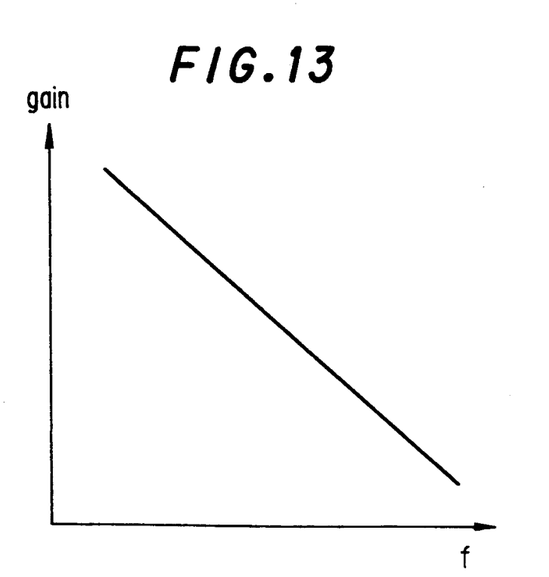

On the other hand, feedback loops having the delay elements 67 and 68 constitute an integrator in the basic part. This integrator has a gain which steadily decreases in terms of frequency as shown in FIG. 13. Accordingly, the overall gain of the basic part is made substantially flat in terms of frequency through the combination of the differentiator and the integrator. On the other hand, the quantization error Q is generated only in the differentiator 65 so that the basic part of the single loop type has a specific noise distribution which is small in a lower frequency range and is great in a higher frequency range, thereby performing a noise shaping operation.

This basic part of the single loop type is added with adders 61 and 62 and a delay element 66 to thereby constitute the delta-sigma modulator of the double loop type shown in FIG. 11. The double loop modulator has an input/output performance represented by:

$$Y = X + (1 - Z^{-1})^2 Q$$

The double loop type modulator operates basically in manner similar to the single loop type modulator. Since another integrator is added, the double loop type modulator can more intensively distribute noise to a higher frequency range as compared to the single loop modulator.

What is claimed is:

1. A digital-to-analog conversion apparatus operative according to a system clock signal for converting a digital input into a corresponding analog output, comprising:

clock means for generating a system clock signal having a given basic frequency and a relatively short period;

dividing means for frequency-dividing the system clock signal to produce a divided clock signal having a frequency one-fourth or less of the basic frequency and a relatively long period;

oversampling means for oversampling a digital input containing a sequence of multi-bit data;

delta-sigma modulating means operative in synchronization with the system clock signal for effecting delta-sigma modulation of the oversampled digital input to produce a requantized digital signal containing, every short period timed by the system clock signal, a requantized data comprised of a lesser number of bits than the multi-bit data;

pulse forming means including first means operative in response to the divided clock signal having the frequency one-fourth or less of the basic frequency during each long period timed by the divided clock signal for effecting a detection of a set of the requantized data occurring during each long period of the detection, and second means operative in response to each detection for effecting pulse modulation of each set of the requantized data to form a pulse signal corresponding to the requantized digital signal according to results of the detection; and     filtering means for filtering the pulse signal to produce an analog output corresponding to the digital input.

2. A digital-to-analog conversion apparatus according to claim 1; wherein the dividing means comprises a frequency-dividing circuit operative to frequency-divide the system clock signal to produce a divided clock signal substantially free of noise which is leaked back into the clock means.

3. A digital-to-analog conversion apparatus according to claim 1; wherein the dividing means comprises counter means for repeatedly counting a given number of clock pulses of the system clock signal at a given count cycle, and decoder means for decoding each of counted results of the counter means to produce a divided clock signal having a reduced frequency determined by the count cycle of the counter means and being substantially free of noise which is leaked back into the clock means.

4. A digital-to-analog conversion apparatus according to claim 1; wherein the first means includes detecting means for detecting a digital value represented by the set of the requantized data in synchronization with the divided clock signal, and the second means includes generating means for generating a pulse signal having a pulse which occurs in synchronization with the divided clock signal and which has a pulse width proportional to the detected digital value.

5. A digital-to-analog conversion apparatus according to claim 1; wherein the first means includes detecting means operative during each long period for detecting individual data contained in each set of the requantized data, and the second means includes generating means for generating a pulse component according to the detected individual data and adding means for adding the generated pulse components with one another to produce a pulse signal having a composite pulse waveform which occurs during each long period and which represents each set of the requantized data.

6. A digital to analog converter comprising:

means for generating a system clock signal having a given basic frequency and a first period;

means for frequency dividing the system clock signal to produce a divided clock signal having a frequency not more than one fourth the given basic frequency and a second period which is longer than the first period;

means for oversampling a digital input comprising a sequence of multi-bit data;

means operative in synchronism with the system clock signal for effecting delta-sigma modulation of the oversampled digital input to produce a requantized digital signal for every first period of the system clock signal comprising a lesser number of bits than the multi-bit data;

means operative in response to the divided clock signal having the frequency not more than one fourth of the given basic frequency during each second period of the divided clock signal for detecting a set of requantized data;

means operative in response to each detection for effecting pulse modulation of each set of requantized data to form a pulse signal; and     means for filtering the pulse signal to produce an analog output corresponding to the digital input.

7. A digital to analog converter according to claim 6; wherein the means for frequency dividing comprises a frequency dividing circuit.

8. A digital to analog converter according to claim 6; wherein the means for frequency dividing comprises counter means for repeatedly counting a given number of clock pulses of the system clock signal at a given count cycle, and decoder means for decoding the count in the counter means to produce the divided clock signal determined by the clock cycle and which is substantially free of noise.

9. A digital to analog converter according to claim 6; wherein the means for detecting comprises means for detecting a digital value in synchronization with the divided clock signal; and the means for effecting pulse modulation includes means for generating a pulse signal in synchronization with the divided clock signal and which has a pulse width proportional to the detected digital value.

10. A digital to analog converter according to claim 6; wherein the means for detecting comprises means operative during each second period for detecting individual data contained in each set of the requantized data; and the means for effecting pulse modulation comprises means for generating a pulse component according to the detected individual data, and means for adding the pulse components to produce a pulse signal having a composite pulse waveform and occurring during each second period and which corresponds to each set of requantized data.

* * * * *